United States Patent [19]

Nozaki et al.

[11] Patent Number: 4,970,693
[45] Date of Patent: Nov. 13, 1990

[54] SEMICONDUCTOR MEMORY DEVICE WITH INTERNAL CONTROL SIGNAL BASED UPON OUTPUT TIMING

[75] Inventors: Shigeki Nozaki; Tsuyoshi Ohira, both of Kawasaki; Masaru Satoh, Yokohama; Tomio Nakano, Kawasaki; Yoshihiro Takemae, Tokyo, all of Japan

[73] Assignee: Fujitsu Limited, Kanagawa, Japan

[21] Appl. No.: 484,474

[22] Filed: Feb. 23, 1990

Related U.S. Application Data

[63] Continuation of Ser. No. 366,208, Jun. 12, 1989, abandoned, which is a continuation of Ser. No. 220,879, Jun. 21, 1988, abandoned, which is a continuation of Ser. No. 794,829, Nov. 4, 1985, abandoned.

[30] Foreign Application Priority Data

Nov. 5, 1984 [JP] Japan .................... 59-232733

[51] Int. Cl.$^5$ .................... G11C 11/413; G11C 7/00
[52] U.S. Cl. .................... 365/226; 365/195; 365/189.05; 365/233
[58] Field of Search .............. 365/226, 233, 233.5, 365/195, 189.09, 189.05; 307/475

[56] References Cited

U.S. PATENT DOCUMENTS

| | | | |
|---|---|---|---|
| 4,165,541 | 8/1979 | Varshney et al. | 365/219 |
| 4,585,955 | 4/1986 | Uchida | 365/226 X |
| 4,616,143 | 10/1986 | Miyamoto | 365/226 X |
| 4,638,182 | 1/1987 | McAdams | 365/226 X |

FOREIGN PATENT DOCUMENTS

0017990 10/1980 European Pat. Off. .
0074206 3/1983 European Pat. Off. .

Primary Examiner—Stuart N. Hecker
Assistant Examiner—Alyssa H. Bowler
Attorney, Agent, or Firm—Armstrong, Nikaido, Marmelstein, Kubovcik & Murray

[57] ABSTRACT

A semiconductor memory device is connected to a power source and includes a reference potential line connected to receive a reference potential from the power source. An input circuit is connected to the reference potential line and receives an external input signal having a logic level defined in reference to the reference potential to be supplied to the source potential line. The output circuit has an external output terminal which is connected to the reference potential line. The output circuit is for generating an output to the external output terminal. An inhibiting circuit inhibits a response to the external input signal of the input circuit for a predetermined period during which the output of the output circuit changes.

4 Claims, 6 Drawing Sheets

SEMICONDUCTOR MEMORY DEVICE WITH INTERNAL CONTROL SIGNAL BASED UPON OUTPUT TIMING

This application is a continuation of application Ser. No. 366,208 filed June 12, 1989; which is a continuation of Ser. No. 220,879 filed June 21, 1988; which is a continuation of Ser. No. 06/794,829, filed Nov. 4, 1985; all now abandoned.

BACKGROUND OF THE INVENTION

1. Field of the Invention

The present invention relates to a semiconductor memory, in particular, to an input circuit which receives an external control signal such as a $\overline{WE}$ (write enable bar) signal.

2. Description of the Related Art

A semiconductor memory device provides an input circuit which is connected to a reference potential line connectable to an external power source and which provides a MOS transistor receiving an external control signal such as a $\overline{WE}$ (a write enable bar) signal at a TTL level. The input circuit outputs an inverted MOS level signal in accordance with a high level or a low level of the external control signal. The semiconductor memory device further provides an output stage transistor which is connected to the reference potential line and which generates a low or high level output by turning the output stage to ON.

The external control signal of the semiconductor memory device, signals such as $\overline{RAS}$ (Row address strobe), $\overline{CAS}$ (Column address strobe), $\overline{OE}$ and $\overline{WE}$ having a TTL level, are used for controlling the mode or timing of operation of the internal circuit in the device. Memory cells are accessed by receiving these signals and address signals, and read and write operations are carried out for the memory cells. The present invention is concerned with the input circuit for these external control signals, particularly the $\overline{WE}$ signal. This input circuit, which receives the TTL level signal supplied to an input terminal, has a high voltage level of 2.4 V or more and a low voltage level of 0.8 V or less and converts the same to a MOS level having a high level power source voltage $V_{CC}$(5 V) or a low level power source voltage $V_{SS}$(0 V). The input circuit activates a clock generator circuit for carrying out a specific operation mode by signals output after the level is converted.

When, for example, the $\overline{WE}$ signal is at a H (high) level, the memory is in a read-out mode, and data in the memory cell selected by address signals is read out externally.

In the circuit as mentioned above, when the output stage transistor is turned ON to make the output level low or high, a comparatively large current flows via the output stage transistor to or from the reference potential line. As the wire for forming the reference potential line has a resistance, then the potential level of the reference potential line rises or falls when the large current flows via the output stage transistor thereto or therefrom.

On the other hand, the TTL level input signal, for example the $\overline{WE}$ signal, has a constant level with respect to the external ground level, that is, lower than 0.8 V for the low level and higher than 2.4 V for the high level with reference to the external ground level. Thus, when the reference potential level inside the device, which should be held at the ground level, rises due to the large current at the output stage, the input stage transistor receiving an input of the TTL high level may not turn ON, so that the input circuit sometimes cannot output a low level output, as explained in detail hereinafter. When the output of the input circuit is not at the L level, a writing mode is operative, and it is possible for the writing circuit inside the device to operate and the memory carry out a write operation. Further, the writing circuit provides a latch function, and thus when the H level output is initially generated, it is latched and a writing error may occur.

When the input logic level is defined with respect to the reference potential level supplied by the high level power source voltage, unlike the above case, the falling of the potential at the reference potential line inside the device accompanied by the high level output at the output stage may cause a similar malfunction at the input stage.

OBJECT AND SUMMARY OF THE INVENTION

An object of the present invention is to remove the above-mentioned drawbacks and to prevent malfunction of the input circuit even when the potential of the reference potential line inside the device rises or falls due to the output current.

The above-mentioned object can be achieved by providing a semiconductor memory device connected to a power source including a reference potential line connected to receive a reference potential from the power source. An input circuit is connected to the reference potential line and receives an external input signal having a logic level defined in reference to the reference potential to be supplied to the source potential line. An output circuit has an external output terminal which is connected to the reference potential line. The output current generates an output to the external output terminal. An inhibiting circuit inhibiting a response to the external input signal of the input circuit for a predetermined period during which the output of the output circuit changes.

Further features and advantages of the present invention will be apparent from the ensuring description with reference to the accompanying drawings to which, however, the scope of the invention is in no way limited.

DESCRIPTION OF THE PREFERRED EMBODIMENTS

Figure 1:
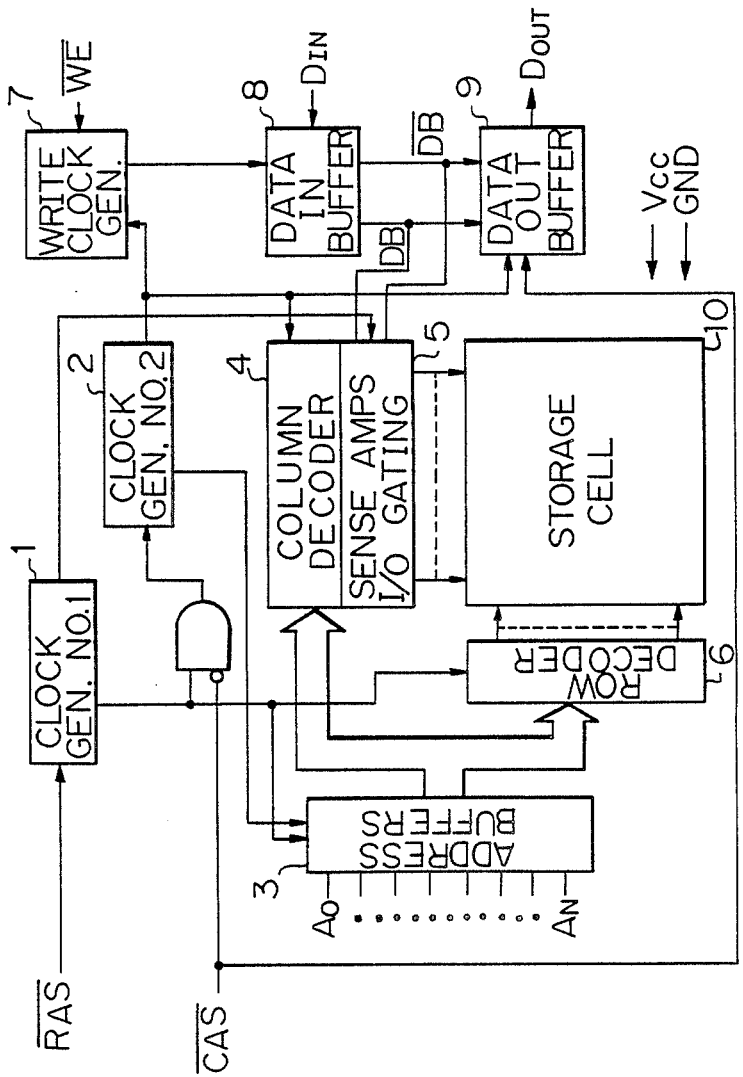
FIG. 1 is a block diagram of the semiconductor memory device to which the present invention is applied.

FIG. 1 is a block diagram of the semiconductor memory device to which the present invention is applied. In FIG. 1, $\overline{RAS}$ denotes a raw address strobe, $\overline{CAS}$ a column address strobe, $A_0$ to $A_N$ address input terminals, $\overline{WE}$ a write enable bar signal, $D_{IN}$ a data input, and $D_{OUT}$ a data output. Further, reference numerals 1 and 2 designate clock generators, reference numeral 3 designates address buffers, reference numerals 4 and 5 designate a column decoder and a sense amplifier respectively, reference numeral 6 designates a row decoder, reference numeral 7 designates write clock generators, reference numeral 8 designates a data-in buffer, reference numeral 9 designates a data-out buffer, reference numeral 10 designates a storage cell. The clock generator 1 generates a clock for operating the sense amplifier 5 and the row decoder 6, and the clock generator 2 generates a clock for operating the column decoder 4, the write clock generator 7, and the data-out buffer 9. The semiconductor memory device receives external control signals such as $\overline{RAS}$, $\overline{CAS}$, and $\overline{WE}$, and the storage cell 10 is accessed and a read or write operation is carried out for the cell.

The present invention is explained below by way of an example wherein the input circuit of the $\overline{WE}$ signal is provided with a means for preventing the aforesaid malfunction in accordance with the present invention. This input circuit is included in the write clock generator 7 and receives the $\overline{WE}$ signal having a TTL level, that is, the high level thereof is 2.4 V or more and the low level thereof is 0.8 V or lower. In the input circuit, this TTL level is converted to a MOS level signal, that is, having a high level that is the same as that of the high power source $V_{CC}$(5 V), a low level that is the same as that of the low power source $V_{SS}$(0), and the write clock generator 7 is operated by this converted output.

Figure 2A:
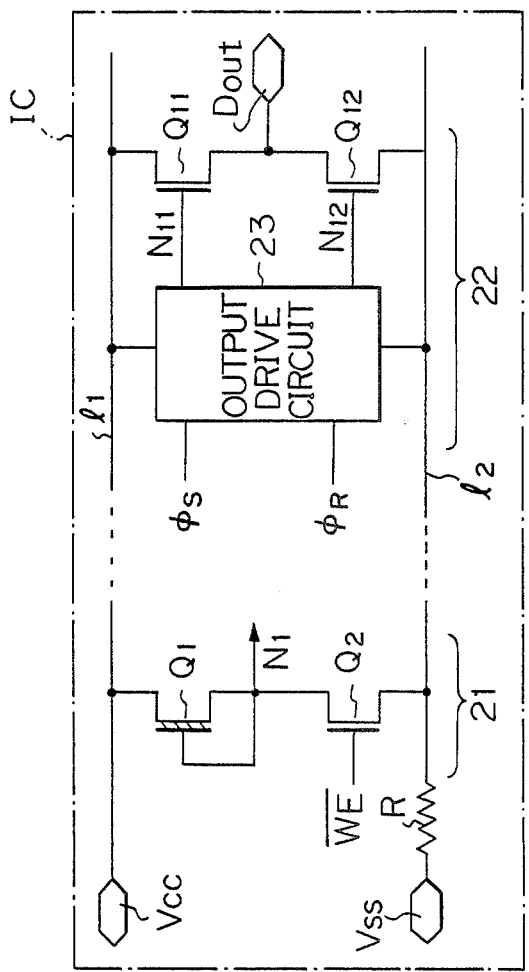
FIGS. 2A and 2B are diagrams of an example of a conventional circuit.

When the $\overline{WE}$ signal is at a H (high) level, the memory is in the read-out mode, and data in the memory cell selected by address signals is read out externally. FIG. 2A shows an output stage of the data output buffer and an input circuit of the $\overline{WE}$ signal, wherein 21 designates the input circuit and 22 designated the output stage. These circuits are connected to the high potential line $l_1$ of the power source and the low potential line $l_2$ of the power source, the latter used as a reference potential line in a TTL logic level system. The input circuit includes a depletion type MOS transistor $Q_1$, in which a gate and a source are short-circuited, and an enhancement type MOS transistor $Q_2$ connected to the transistor $Q_1$ in series. The input circuit is formed as an inverter having a series-connected point $N_1$ as an output terminal. The input $\overline{WE}$ signal enters a gate of the transistor $Q_2$, and when the input signal is at a H level and exceeds the threshold value of the transistor $Q_2$, the transistor $Q_2$ turns ON and the output, that is, the level at the node $N_1$ becomes a L level ($V_{SS}$). When the input signal is a low level and below the threshold level of the transistor $Q_2$, the transistor $Q_2$ turns OFF, and the output becomes a H level ($V_{CC}$). This threshold level is set at an intermediate level between the TTL low and high levels, for example, at 1.6 V.

Figure 2B:
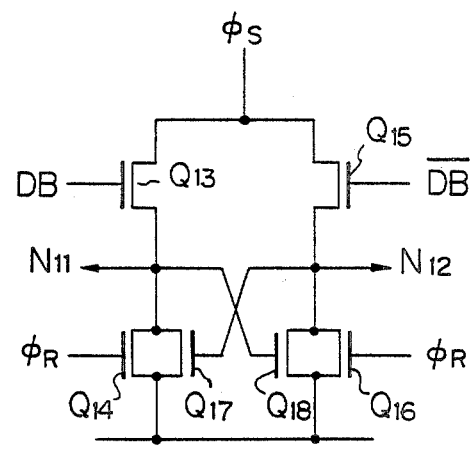

The output stage 22 includes an output circuit having enhancement type MOS transistors $Q_{11}$, $Q_{12}$ connected in series, and a series-connected point used as an output terminal $D_{out}$ and an output drive circuit 23 thereof. The output drive circuit is formed as shown in FIG. 2B. In FIG. 2B, transistors $Q_{13}$ to $Q_{18}$ are MOS transistors, and $\phi_S$ and $\phi_R$ are set and reset clocks for operating the drive circuit 23. Cell data DB and $\overline{DB}$ are supplied from the sense amplifier 5 (shown in FIG. 1) to the gate of the transistors $Q_{12}$ and $Q_{15}$ respectively. In FIG. 2B, the transistors $Q_{17}$ and $Q_{18}$ for forming a latch and reset transistors $Q_{14}$ and $Q_{16}$ are provided so that the circuit is operated in a stabilized condition, therefore these transistors are not always necessary.

When the set clock $\phi_S$ rises and the cell data is "1", that is, DB=high and $\overline{DB}$=low, the signal at node $N_{11}$ between the transistors $Q_{13}$ and $Q_{14}$ becomes H (high) level and the signal at node $N_{12}$ between the transistors $Q_{15}$ and $Q_{16}$ becomes L (low) level. These signal levels at nodes $N_{11}$ and $N_{12}$ are maintained until the latch is reset by the reset transistors $Q_{14}$ and $Q_{16}$ by reset clock $\phi_R$. As a result, the transistor $Q_{11}$ turns ON and the transistor $Q_{12}$ turns OFF, so that the output $D_{out}$ (herein the node and its level are shown by the same symbol) is an H level ($V_{CC}$). When the data in the cell is "0" and the clock $\phi_S$ rises, the output signal $N_{12}$ of the driving circuit 22 becomes H, $N_{11}$ becomes L, the transistor $Q_{11}$ turns OFF, and the transistor $Q_{12}$ turns ON, so that the output $D_{out}$ becomes a L level ($V_{SS}$). Thus, the output drive circuit 23 receives the data read out by the clock signal $\phi_S$ and holds the data until the reset signal $\phi_R$ is received, and continuously drives the output circuit.

Figure 3:
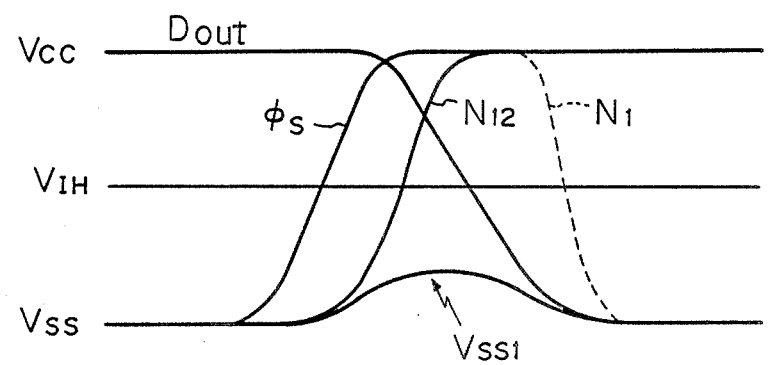
FIG. 3 is a diagram showing waveforms for explaining the operation of the conventional circuit shown in FIG. 2.

When the transistor $Q_{12}$ turns ON and the output $D_{out}$ becomes L, the current flows along the path $D_{out}$, $Q_{12}$, and $V_{SS}$. The wire of the power source includes a resistance, shown by R in FIG. 2A. When the transistor $Q_{12}$ at the output stage turns ON, the current flowing along the path mentioned above is comparatively large, and the phenomenon occurs whereby the level at the wiring $l_2$ of $V_{SS}$ rises from $V_{22}$, that is, 0 V, by the resistance mentioned above. $V_{SS1}$ in FIG. 3 shows this rise in the level of the wiring of $V_{SS}$. On the other hand, the $\overline{WE}$ signal may be as high as slightly lower than 0.8 V when it indicates a L level ($V_{IL}$) and may be as low as slightly higher than 2.4 V when it indicates a H level ($V_{IH}$), in the TTL logic level system. The input transistor $Q_2$ can be turned on only when the difference between the input level at its gate and the internal $V_{SS}$ level applied to its source exceeds the threshold value of for example, 1.6 V. Then, if the level at the wiring $l_2$ of $V_{SS}$ rises, the transistor $Q_2$ does not turn ON, even when the $\overline{WE}$ signal is a the H level, so that the problem occurs wherein the node $N_1$ does not generate an L output. When the output $N_1$ of the input circuit is not L level, that is, at an H level, it is in the writing mode, and it is possible for the writing circuit in the device to operate and the memory to carry out the writing operation. Further, the writing circuit (not shown in the drawing) provides a latch function, so that, when the H level output is initially generated, this it is latched and an writing error may occur.

Figure 4:
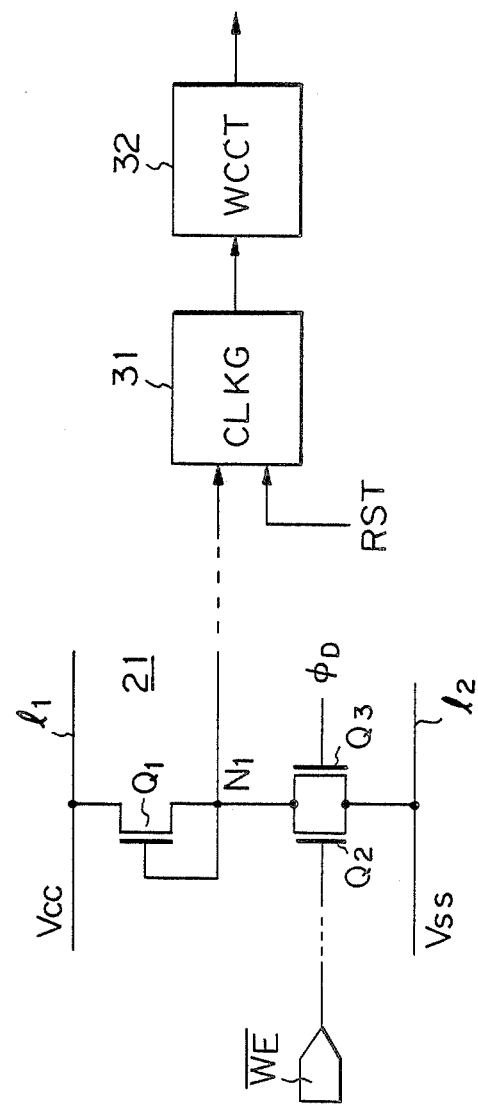
FIG. 4 is a diagram showing one embodiment of the circuit according to the present invention.
Figure 5:
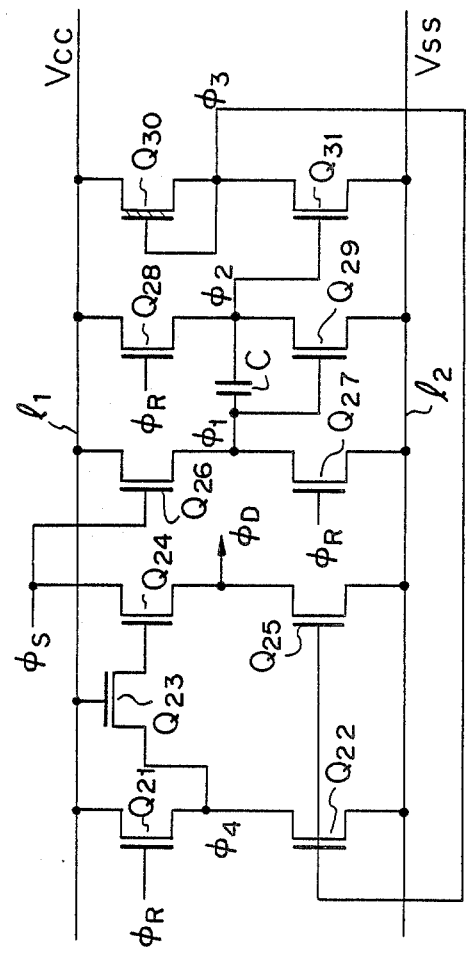
FIG. 5 is a diagram showing an embodiment of the circuit for generating a signal $\phi_D$ used in the circuit shown in FIG. 4.

The present invention will be explained in reference to FIGS. 4 to 7. As shown in FIG. 4, $Q_1$ and $Q_2$ are the MOS transistors in the input circuit as shown in FIG. 2A. The $\overline{WE}$ signal applied to the terminal pin of the memory chip is input to the gate of the transistor $Q_2$. The output of the node $N_1$ is applied to a clock pulse generator circuit 31 in the writing system so that various clocks are generated and these are input to the writing circuit 32. RST designates a reset signal for stopping the generation of the clock in the circuit 31. In the present invention, a transistor $Q_3$ is connected in parallel to the transistor $Q_2$ in the input circuit 21, and a signal is applied to the gate of this enhancement type MOS transistor $Q_3$. The signal $\phi_D$ is, ①the same as the input signal $\phi_S$ of the driving circuit 23, or ②, the signal which rises together with $\phi_S$ and fails thereafter (at the time when the rise of the wiring $l_2$ of the power source is finished). Two kinds of memory exist, that is, the first memory exists when the output stage transistor $Q_{12}$ or $Q_{11}$ is turned ON (the state which the output is held), the $\overline{WE}$ signal will not be received even if the $\overline{WE}$ signal is input (or varied), and only when both the output transistors $Q_{11}$ and $Q_{12}$ are turned OFF, will the $\overline{WE}$ signal be received; the second memory exists even when the output stage transistor $Q_{12}$ or $Q_{11}$ is turned ON, the $\overline{WE}$ signal is received and the write operation becomes possible. The former is applied with ①, and the latter with ② mentioned above. FIG. 5 shows the circuit for generating the $\phi_D$ of ② mentioned above.

In FIG. 5, $Q_{21} \sim Q_{31}$ are MOS transistor, and these transistors are connected between the power sources $V_{CC}$ and $V_{SS}$. $\phi_S$ and $Q_R$ are a set signal and a reset signal supplied to the driving circuit 23 as mentioned above, and in the present circuit, they are supplied to the transistors $Q_{24}$ and $Q_{26}$ and the transistors $Q_{21}$, $Q_{27}$, and $Q_{28}$.

The operation will be explained by referring to FIG. 6. When the signal $\phi_S$ rises and $\phi_R$ falls, the output $D_{out}$ falls, as already mentioned. Until that time, as the signal $\phi_R$ is H and $\phi_S$ is L, the transistors $Q_{21}$, $Q_{27}$ and $Q_{28}$ are turned ON, the transistors $Q_{26}$ and $Q_{29}$ are turned OFF, the transistor $Q_{31}$ is turned ON, the signal $\phi_3$ is L, and the transistors $Q_{22}$ and $Q_{25}$ are turned OFF. Further, because the transistor $Q_{23}$ is turned ON, the transistor $Q_{24}$ is turned ON, and because the signal $\phi_S$ is L, the signal $\phi_D$ is also L. The capacitor C is charged up from the power source $V_{CC}$ at the interconnection node between transistors $Q_{28}$ and $Q_{29}$ as the positive side.

In this state, when the signal $\phi_S$ rises and the signal $\phi_R$ falls, the signal $\phi_D$ rises together with the signal $\phi_S$ via the transistor $Q_{24}$, which is turned ON. Further, the transistors $Q_{27}$ and $Q_{28}$ turn OFF and the transistor $Q_{26}$ turns ON, so that the potential at a node $\phi_1$ rises. Accordingly, the transistor $Q_{31}$ is maintained at in an ON state until the transistor $Q_{29}$ turns ON and the signal $\phi_3$ is also maintained at the L level. When the transistor $Q_{29}$ turns ON, the potential at a node $\phi_2$ falls, the transistor $Q_{31}$ then turns OFF, and the potential at a node $\phi_3$ rises. When the signal $\phi_3$ rises, the transistors $Q_{22}$ and $Q_{25}$ turn ON, the potential at a node $\phi_4$ falls, and the signal $\phi_D$ also falls. Thus, the signal $\phi_D$ rises together with the rise of the signal $\phi_S$, then falls so that a temporarily generated pulse is formed. The generating period of this pulse can be set by the capacity of the capacitor C.

Figure 6:
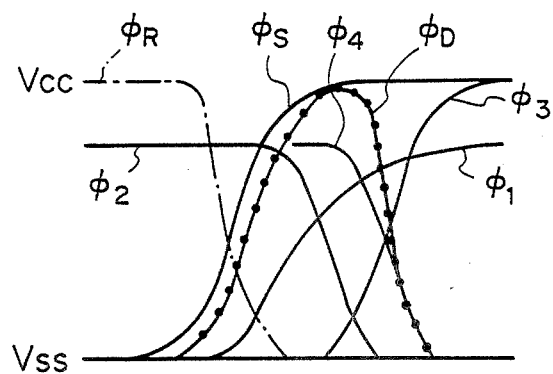
FIGS. 6 and 7 are diagrams showing waveforms explaining the operation of the circuit shown in FIGS. 4 and 5.
Figure 7:
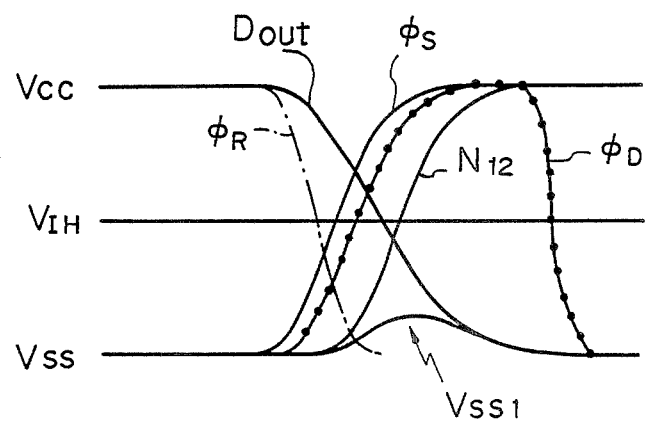

FIG. 7 is similar to FIG. 6, and shows the level change of the output $D_{OUT}$, $V_{SS}$, etc., and that the width of the signal $\phi_D$ is selected to be larger than the period of the level change $V_{SS1}$.

Since the level change at the $V_{SS}$ line $l_2$ is also applied to the other circuit of the memory, it is possible to provide the inhibiting circuit as described above to other input circuits which possibly suffer from such level change and generate malfunctions.

As mentioned above, according to the present invention, malfunction of the external control signal input circuit due to the level change at the $V_{SS}$ wiring can be prevented so as to contribute to an improvement of the reliability of the MOS memory.

We claim:

1. A semiconductor memory device connectable to a power source comprising:
    a power source line connected to receive a power source potential from said power source;
    a reference potential line connected to receive a reference potential from said power source;
    a storage cell for storing data;
    an input circuit connected between said power source line and said reference potential line and receiving an external input signal having a logic level defined in reference to said reference potential to be supplied to said reference potential line, said input circuit producing an internal logic signal representing one of binary logic levels;
    an output circuit having a pair of output transistors connected in series between said power source line and said reference potential line and an external output terminal connected to a series connection node between said pair of output transistors, for generating an output to said external output terminal;
    an output drive circuit connected to said output circuit, for driving said pair of output transistors by alternately rendering one of said output transistors conductive to generate the output at said external output terminal corresponding to data read out from the storage cell at a predetermined timing when said storage cell is accessed;
    control pulse generating means for generating a control pulse at a timing determined in relation to said predetermined timing so that said control pulse is generated when a change of the output of said circuit occurs; and
    an inhibiting circuit connected to receive said control pulse and to said input circuit, said inhibiting circuit inhibiting a change of the internal logic signal of the input circuit in the binary logic levels irrespective of said external input signal when said control pulse is applied thereto, said internal logic signal of the input circuit being variable to represent either of the binary logic levels in response to said external input signal when said inhibiting circuit is not applied with said control pulse.

2. A semiconductor memory device according to claim 1, wherein said input circuit provides a MOS transistor which receives a write enable bar signal having a TTL level and outputs an inverted signal of said write enable bar signal having a MOS level, said output circuit provides an output stage transistor connected to the reference potential line and outputs a low level output by turning said output stage transistor ON, and said inhibiting circuit is formed by a transistor which is connected in parallel with said MOS transistor in said input circuit and which turns ON for a predetermined period during which said output transistor turns ON.

3. A semiconductor memory device according to claim 1 wherein said input circuit is a write enable input circuit.

4. A semiconductor memory device according to claim 1, wherein said output transistors are MOS transistors.

* * * * *